United States Patent
Lee et al.

(10) Patent No.: US 9,196,483 B1
(45) Date of Patent: Nov. 24, 2015

(54) CARRIER CHANNEL WITH ELEMENT CONCENTRATION GRADIENT DISTRIBUTION AND FABRICATION METHOD THEREOF

(71) Applicant: NATIONAL TSING HUA UNIVERSITY, Hsinchu (TW)

(72) Inventors: Ming-Chang Lee, Hsinchu (TW); Chih-Kuo Tseng, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/483,169

(22) Filed: Sep. 11, 2014

(30) Foreign Application Priority Data

May 14, 2014 (TW) .............................. 103116982 A

(51) Int. Cl.
| | |
|---|---|
| H01L 21/76 | (2006.01) |
| H01L 21/02 | (2006.01) |
| H01L 29/36 | (2006.01) |
| H01L 29/10 | (2006.01) |

(52) U.S. Cl.
CPC .... *H01L 21/02667* (2013.01); *H01L 21/02381* (2013.01); *H01L 21/02642* (2013.01); *H01L 29/1029* (2013.01); *H01L 29/36* (2013.01)

(58) Field of Classification Search
CPC ....................... H01L 21/7682; H01L 23/5222
USPC ................... 438/421, 492, 947, 97, 294, 400; 257/655
See application file for complete search history.

(56) References Cited

U.S. PATENT DOCUMENTS

| | | | | |
|---|---|---|---|---|
| 5,532,495 | A * | 7/1996 | Bloomquist | B29C 59/16 250/492.1 |
| 6,495,871 | B2 * | 12/2002 | Hattori | H01L 29/1095 257/279 |
| 6,690,004 | B2 * | 2/2004 | Miller | G01N 27/624 250/282 |
| 2003/0071246 | A1 * | 4/2003 | Grigorov | C08F 8/44 252/500 |
| 2005/0048787 | A1 * | 3/2005 | Negishi | H01L 21/0275 438/706 |
| 2009/0029548 | A1 * | 1/2009 | Jung | H01L 21/02071 438/669 |
| 2010/0264403 | A1 * | 10/2010 | Sirringhaus | B82Y 10/00 257/24 |
| 2011/0097881 | A1 | 4/2011 | Imec et al. | |

* cited by examiner

*Primary Examiner* — Jami M Valentine
(74) *Attorney, Agent, or Firm* — CKC & Partners Co., Ltd.

(57) ABSTRACT

The present disclosure provides a carrier channel with an element concentration gradient distribution. The carrier channel includes a substrate and a carrier channel structure. The carrier channel structure is stacked on the substrate, wherein a ratio of a height and a width of the carrier channel is greater than 1, and the carrier channel is crystallized from the contact surface by a rapid melting growth process, thus the carrier channel structure has the element concentration gradient distribution.

14 Claims, 4 Drawing Sheets

CARRIER CHANNEL WITH ELEMENT CONCENTRATION GRADIENT DISTRIBUTION AND FABRICATION METHOD THEREOF

RELATED APPLICATIONS

This application claims priority to Taiwan Application Serial Number 103116982, filed May 14, 2014, which is herein incorporated by reference.

BACKGROUND

1. Technical Field

The present disclosure relates to a carrier channel and a fabricating method thereof. More particularly, the present disclosure relates to a carrier channel with an element concentration gradient distribution and a fabricating method thereof.

2. Description of Related Art

In semiconductor devices, the carrier concentration in the active region would affect the performance of the device. How to control the carrier concentration and the carrier location precisely is a concerned issue in the semiconductor industry.

In the semiconductor industry, the thermal diffusion process and the ion implantation process have been widely used to control the carrier concentration and the carrier distribution. The thermal diffusion process promoted the carrier moving from high concentration region to low concentration region by using high temperature. But the thermal diffusion process consumes amount of time and energy, and it would increase the thermal budget and the production costs of the device significantly. Furthermore, the thermal diffusion process is only applied to the shallow area of the device.

Ion implantation process injects the carriers into the active region of the device by using an electric field to accelerate the carriers. The carrier distribution and the carrier location could be change by adjusting the electric field. Because the carriers acceleration by the electric field has strong energy, the carriers would damage the surface lattice of the device and generate form a lattice defect. Although the lattice defect can be repaired by executing an annealing process after the ion implantation process, but the annealing process increases the production costs of the device.

As foregoing mention, the conventional techniques should be improved by additional and time-consuming high temperature annealing process. However, the high temperature annealing process always increases the production costs.

SUMMARY

According to one aspect of the present disclosure, a fabricating method of a carrier channel with an element concentration gradient distribution is provided. The method includes, a substrate is provided. A first isolation layer is formed on the substrate, and the first isolation layer has a first through hole. A stacking layer is formed on the first isolation layer, wherein the stacking layer is filled into the first through hole and contacts with the substrate. A second isolation layer is formed on the stacking layer. A transfer pattern is defined on the second isolation layer by a photolithographic etching process, wherein the second isolation layer having the transfer pattern is a hard mask. The transfer pattern is transferred onto the stacking layer by a selective etching process and the hard mask. A third isolation layer is formed on the substrate, wherein the third isolation layer covers the first isolation layer, the stacking layer, and the hard mask. A rapid melting growth process is executed for crystallizing the stacking layer into the carrier channel from a contact surface between the stacking layer and the substrate, wherein the carrier channel has the element concentration gradient distribution.

According to another aspect of the present disclosure, a carrier channel with an element concentration gradient distribution is provided. The carrier channel includes a substrate and a carrier channel structure. The carrier channel structure is stacked on the substrate, wherein a ratio of a height and a width of the carrier channel is greater than 1, and the carrier channel is crystallized from the contact surface by a rapid melting growth process, thus the carrier channel structure has the element concentration gradient distribution.

BRIEF DESCRIPTION OF THE DRAWINGS

The present disclosure can be more fully understood by reading the following detailed description, with reference made to the accompanying drawings as follows.

DETAILED DESCRIPTION

Figure 1:
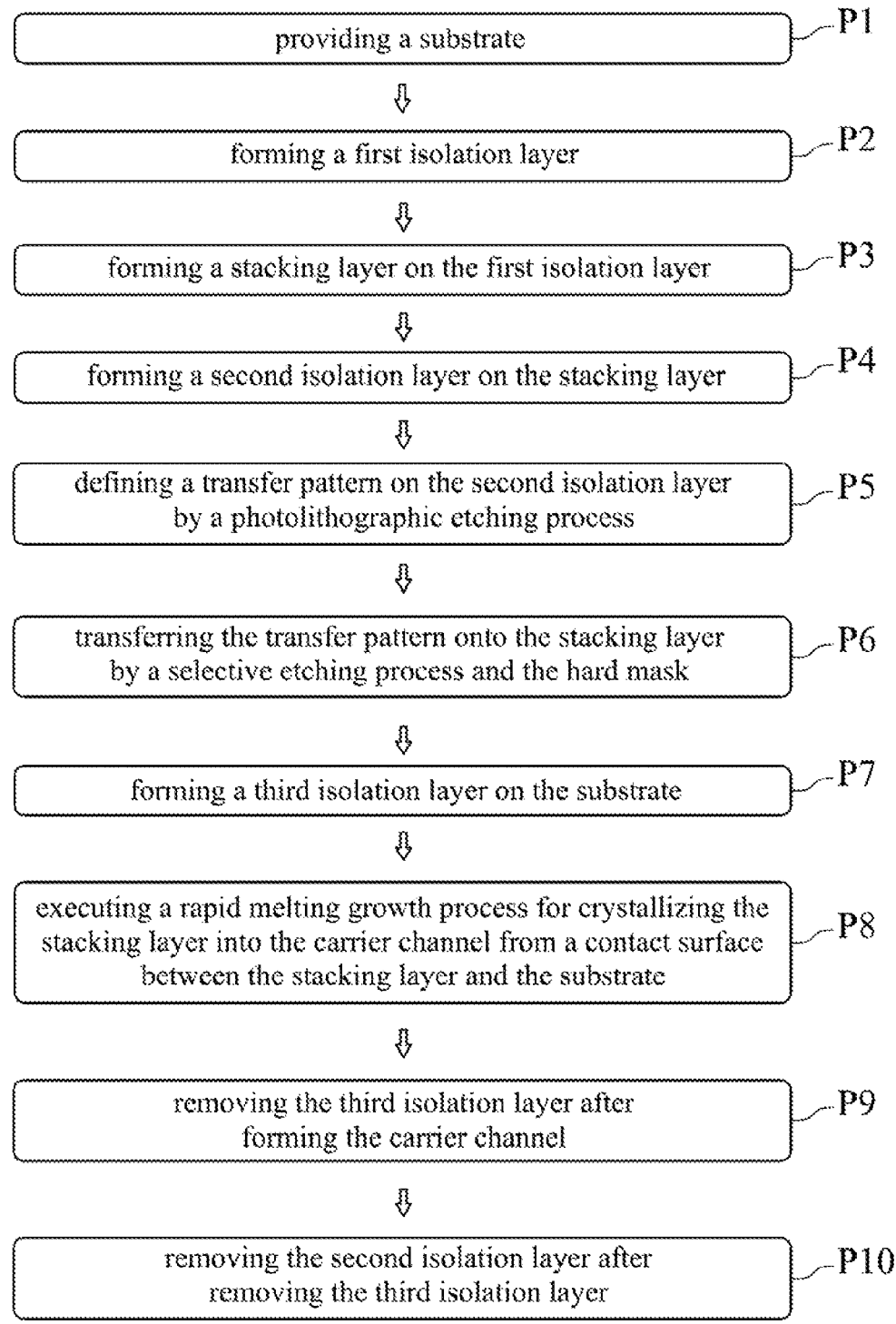
FIG. 1 is a flowchart of a fabricating method of a carrier channel with an element concentration gradient distribution according to one embodiment of the present disclosure.

FIG. 1 is a flowchart of a fabricating method of a carrier channel with an element concentration gradient distribution according to one embodiment of the present disclosure, and the fabricating method includes the following steps.

Step P1, a substrate is provided and the substrate can be made of a single-layer material or a multilayer material which are compatible with a semiconductor process. Therefore, the carrier channel fabricated by the fabricating method can be integrated with the other semiconductor element on a chip. The substrate can be a monocrystalline silicon substrate, a polycrystalline silicon substrate or an amorphous silicon substrate.

Step P2, a first isolation layer is formed on the substrate and the first isolation layer has a first through hole. The first through hole is formed through the first isolation layer. The shape of the first through hole can be varied on demand. Furthermore, the first isolation layer can be an oxide layer or a nitride layer.

Step P3, a stacking layer is formed on the first isolation layer, wherein the stacking layer is filled into the first through hole and contacts with the substrate. In step P3, the stacking layer is formed by a vapor deposition technique, an epitaxy technique or other techniques which compatible with semiconductor fabrication process. Moreover, the stacking layer is made of germanium-tin or silicon-germanium-tin.

Step P4, a second isolation layer is formed on the stacking layer. The second isolation layer can be an oxide layer or a nitride layer.

Step P5, a transfer pattern is defined on the second isolation layer by a photolithographic etching process, wherein the second isolation layer having the transfer pattern is a hard mask.

Step P6, the transfer pattern is transferred onto the stacking layer by a selective etching process and the hard mask. The stacking layer is protected from the selective etching process by the hard mask, and the transfer pattern is transferred on the stacking layer. Hence, the desire shape of the stacking layer is defined by the transfer pattern.

Step P7, a third isolation layer is formed on the substrate, wherein the third isolation layer covers the first isolation layer, the stacking layer, and the hard mask. The third isolation layer can be an oxide layer or a nitride layer.

Step P8, a rapid melting growth process is executed for crystallizing the stacking layer into the carrier channel from a contact surface between the stacking layer and the substrate, wherein the carrier channel has the element concentration gradient distribution. In step P8, since the covering of the third isolation layer, the stacking layer is preserved from impurity contamination, and the element of the stacking layer would not escape easily.

Further, the fabricating method can includes Steps P9 and P10. In step P9, the third isolation layer is removed after forming the carrier channel. Removing the third isolation layer contributes to remove the second isolation layer.

Step P10, the second isolation layer is removed after removing the third isolation layer. Removing the second isolation layer contributes to fabricate a device which using the carrier channel of the present disclosure as the active region.

As mentioned fabricating method in FIG. 1, a carrier channel with an element concentration gradient distribution is fabricated. With different requirements of the device, we can choose a suitable region on the carrier channel with an acceptable carrier concentration. Therefore, the fabricating method not only simplifies the process which used to control the carrier concentration, but also reduces the production cost.

Figure 2:
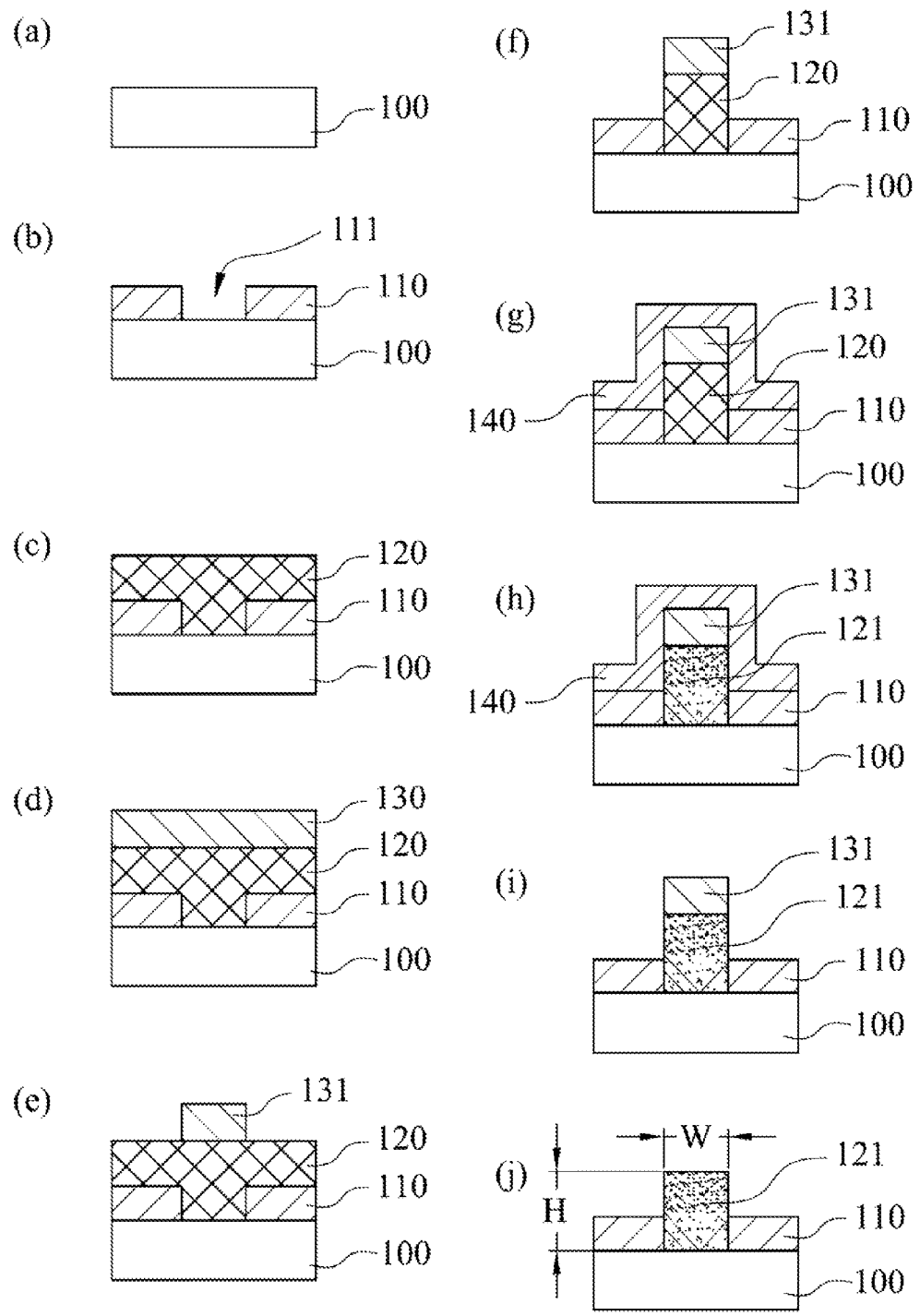
FIG. 2 is a schematic diagram of the fabricating method according to the embodiment of FIG. 1.

FIG. 2 is a schematic diagram of the fabricating method according to the embodiment of FIG. 1. The fabricating method includes the following steps and detailed described as below. Step (a), a monocrystalline silicon substrate 100 is provided. Step (b), a first oxide isolation layer 110 is formed on the monocrystalline silicon substrate 100 by a vapor deposition technique, and the first oxide isolation layer 110 has a first through hole 111. The first through hole 111 pass through the first oxide isolation layer 110. Step (c), a germanium-tin stacking layer 120 is formed on the first oxide isolation layer 110 by an epitaxy technique, and the germanium-tin stacking layer 120 is filled into the first through hole 111 and contacts with the monocrystalline silicon substrate 100. Step (d), a second oxide isolation layer 130 is formed on the germanium-tin stacking layer 120 by a vapor deposition technique. Step (e), a transfer pattern is defined on the second oxide isolation layer 130 by a photolithographic etching process, wherein the second isolation layer 130 having the transfer pattern is a hard mask 131.

Step (f), the transfer pattern is transferred onto the germanium-tin stacking layer 120 by a selective etching process and the hard mask 131. The germanium-tin stacking layer 120 is protected from the selective etching by the hard mask 131, and the germanium-tin stacking layer 120 has the same shape with the hard mask 131. Step (g), a third oxide isolation layer 140 is formed on the monocrystalline silicon substrate 100 by a vapor deposition technique, and the third oxide isolation layer 140 covers the first oxide isolation layer 110, the germanium-tin stacking layer 120, and the hard mask 131. Step (h), a rapid melting growth process is executed for crystallizing the germanium-tin stacking layer 120 into the carrier channel 121 from a contact surface between the germanium-tin stacking layer 120 and the monocrystalline silicon substrate 100, and the carrier channel 121 has the element concentration gradient distribution. In the carrier channel 121, the germanium atom concentration is decreased from the contact surface, and the tin atom concentration is increased from the contact surface. Since the covering of the covering of the third oxide isolation layer 140, the germanium-tin stacking layer 120 is preserved from impurity contamination, and the element of the stacking layer would not escape easily. Step (i), the third oxide isolation layer 140 is removed after forming the carrier channel 121. Step (j), the second isolation layer 130 is removed after removing the third oxide isolation layer 140 and a ratio of a height (H) and a width (W) of the carrier channel 121 is greater than 1.

As mentioned fabricating method, the carrier channel 121 is fabricated on the monocrystalline silicon substrate 100 by using a rapid melting growth process. The concentration of germanium atom and tin atom in the carrier channel 121 are gradually distributed according to the distance from the contact surface. The fabricating method of the embodiment doesn't execute additional fabrication process to control or change the carrier concentration in the carrier channel 121. The carrier channel 121 can be as applied on a metal oxide semiconductor transistor, a light-emitting device or a photodetector. In addition, the rapid melting growth process is quick and it contributes to reduce the thermal budget and production cost.

Figure 3:
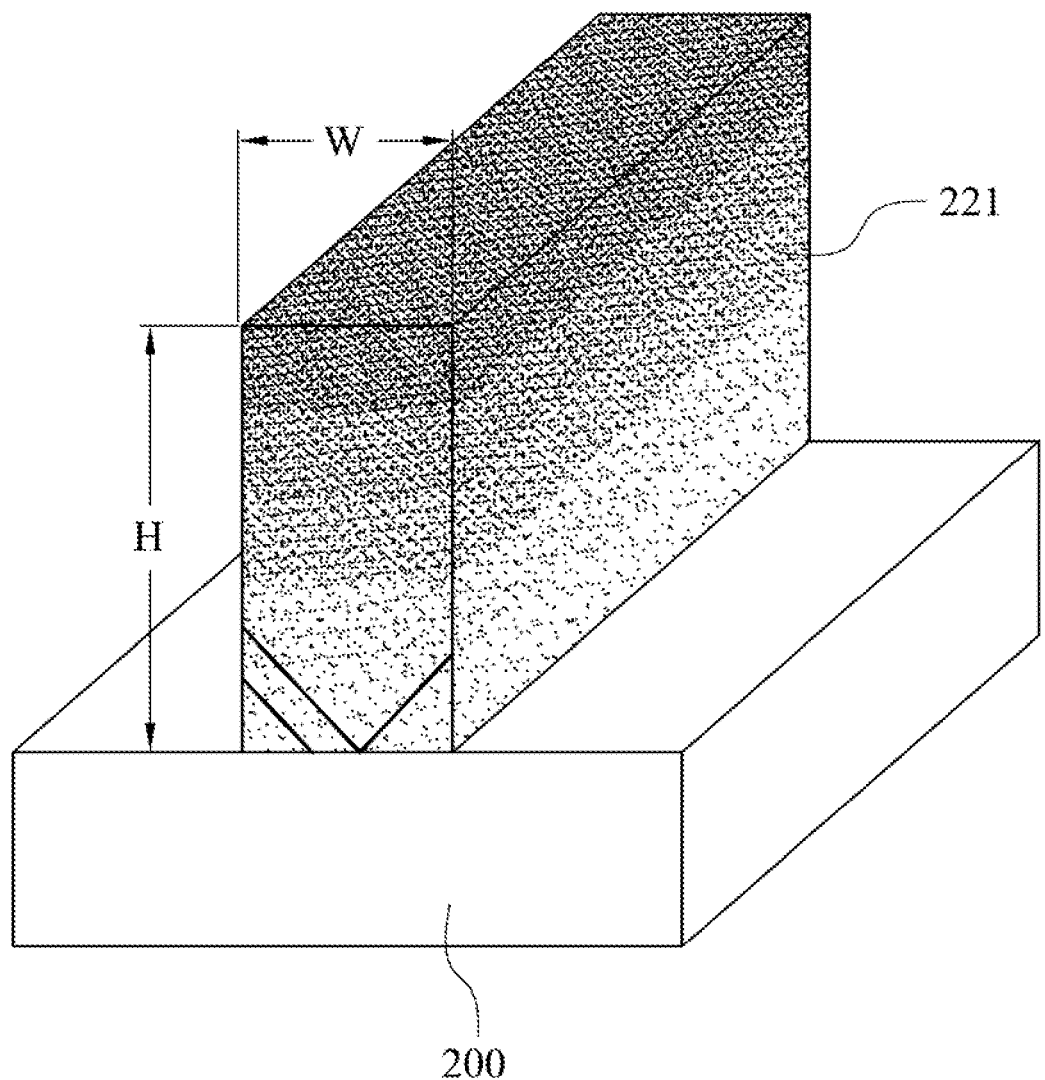
FIG. 3 is a schematic diagram of a carrier channel with an element concentration gradient distribution according to another embodiment of the present disclosure.

FIG. 3 is a schematic diagram of a carrier channel with an element concentration gradient distribution according to another embodiment of the present disclosure. The carrier channel with an element concentration gradient distribution includes a monocrystalline silicon substrate 200 and a germanium-tin carrier channel structure 221.

The monocrystalline silicon substrate 200 is compatible with a semiconductor process. The germanium-tin carrier channel structure 221 is stacked on the monocrystalline silicon substrate 200 and having a contact surface contacted with the monocrystalline silicon substrate 200. The germanium-tin carrier channel structure 221 is crystallized from the contact surface by a rapid melting growth process, the germanium-tin carrier channel 221 structure has the element concentration gradient distribution and a ratio of a height (H) and a width (W) of the germanium-tin carrier channel structure 221 is greater than 1.

Figure 4:
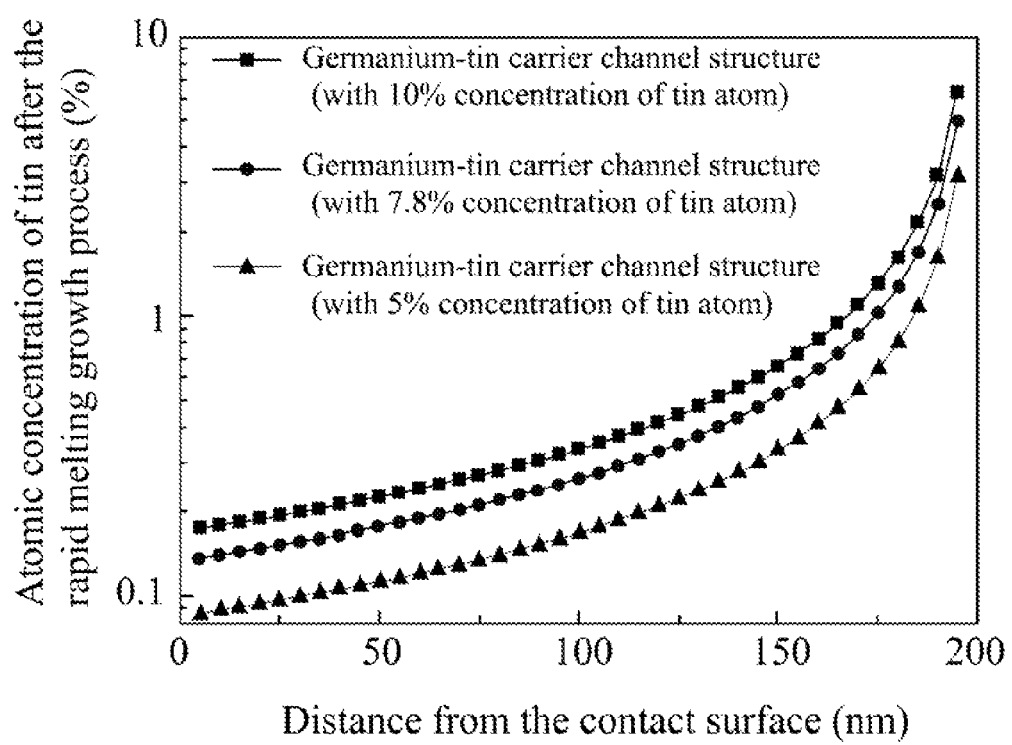
FIG. 4 illustrates a tin concentration distribution (%)-distance (nm) of the carrier channel of FIG. 3.

FIG. 4 illustrates a tin concentration distribution (%)-distance (nm) of the carrier channel of FIG. 3, wherein the tin distribution is a atomic concentration after the rapid melting growth process and the distance is a point parting from the contact surface. In the germanium-tin carrier channel structure 221, the atom concentration of germanium is decreased from the contact surface, and the atom concentration of tin is increased from the contact surface. In FIG. 4, the germanium-tin carrier channel (with 10% concentration of tin atom) as an example, at the distance from the contact surface is 25 nm, the concentration of tin atom is 0.2%. At the distance from the contact surface is 100 nm, the concentration of tin atom is 0.35%. At the distance from the contact surface is 190 nm, the concentration of tin atom is promote to 6.5%. In this embodiment, the height (H) of germanium-tin carrier channel is only 200 nm, but the distribution variance of tin atom concentration is more than 30 times.

As mentioned of the embodiment, the concentration distribution of the element in the carrier channel is quite extensive. The different distance from the contact surface can be chosen to be the active region of device with different performances. In addition, the element concentration of the germanium-tin carrier channel structure 221 can be adjusted in order to apply on different fabricating condition. Furthermore, the monocrystalline silicon substrate 200 has a well thermal conduction, it provides quick heat dissipation under high speed operation and can avoid to reduce the efficiency of the device from the heat accumulation.

In summary, the present disclosure provides a carrier channel with an element concentration gradient distribution and a fabricating method thereof. This present disclosure provides a well section in the carrier channel to fabricate a device with acceptable carrier concentration by change the distance from the contact surface without additional process to adjust the carrier concentration. Because the extensive distribution of the element in the carrier channel, the carrier channel can be applied in a metal oxide semiconductor transistor, a light-emitting device or a photo-detector. Furthermore, the rapid melting growth process is quick and it contributes to reduce the thermal budget and production cost.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A fabricating method of a carrier channel with an element concentration gradient distribution, comprising:
    providing a substrate;
    forming a first isolation layer having a first through hole on the substrate;
    forming a stacking layer on the first isolation layer, wherein the stacking layer is filled into the first through hole and contacts with the substrate;
    forming a second isolation layer on the stacking layer;
    defining a transfer pattern on the second isolation layer by a photolithographic etching process, wherein the second isolation layer having the transfer pattern is a hard mask;
    transferring the transfer pattern onto the stacking layer by a selective etching process and the hard mask;
    forming a third isolation layer on the substrate, wherein the third isolation layer covers the first isolation layer, the stacking layer, and the hard mask; and
    executing a rapid melting growth process for crystallizing the stacking layer into the carrier channel from a contact surface between the stacking layer and the substrate, wherein the carrier channel has the element concentration gradient distribution.

2. The fabricating method of the carrier channel with the element concentration gradient distribution of claim 1, further comprising:
    removing the third isolation layer after forming the carrier channel.

3. The fabricating method of the carrier channel with the element concentration gradient distribution of claim 2, further comprising:
    removing the second isolation layer after removing the third isolation layer.

4. The fabricating method of the carrier channel with the element concentration gradient distribution of claim 3, further comprising:
    removing the first isolation layer after removing the second isolation layer.

5. The fabricating method of the carrier channel with the element concentration gradient distribution of claim 1, wherein the substrate is made of a single-layer material or a multilayer material which are compatible with a semiconductor process.

6. The fabricating method of the carrier channel with the element concentration gradient distribution of claim 1, wherein the substrate is a monocrystalline silicon substrate, a polycrystalline silicon substrate or an amorphous silicon substrate.

7. The fabricating method of the carrier channel with the element concentration gradient distribution of claim 1, wherein the stacking layer is made of germanium-tin or silicon-germanium-tin.

8. The fabricating method of the carrier channel with the element concentration gradient distribution of claim 1, wherein the first isolation layer, the second isolation layer, or the third isolation layer is an oxide layer.

9. The fabricating method of the carrier channel with the element concentration gradient distribution of claim 1, wherein the first isolation layer, the second isolation layer, or the third isolation layer is a nitride layer.

10. The fabricating method of the carrier channel with the element concentration gradient distribution of claim 1, wherein a ratio of a height and a width of the carrier channel is greater than 1.

11. A carrier channel with an element concentration gradient distribution, comprising:
    a substrate; and
    a carrier channel structure stacked on the substrate and having a contact surface contacted with the substrate, wherein a ratio of a height and a width of the carrier channel is greater than 1, and the carrier channel structure is crystallized from the contact surface by a rapid melting growth process, thus the carrier channel structure has the element concentration gradient distribution.

12. The carrier channel with an element concentration gradient distribution of claim 11, wherein the substrate is made of a single-layer material or a multilayer material which are compatible with a semiconductor process.

13. The carrier channel with an element concentration gradient distribution of claim 11, wherein the substrate is monocrystalline silicon substrate, a polycrystalline silicon substrate or an amorphous silicon substrate.

14. The carrier channel with an element concentration gradient distribution of claim 11, wherein the carrier channel structure is a germanium-tin carrier channel structure or a silicon-germanium-tin carrier channel structure.

* * * * *